(12) United States Patent
Hsu et al.

(10) Patent No.: US 10,329,368 B2
(45) Date of Patent: Jun. 25, 2019

(54) PHOTOSENSITIVE RESIN COMPOSITION, AND FILM AND PRINTED CIRCUIT BOARD USING SAME

(71) Applicant: Zhen Ding Technology Co., Ltd., Tayuan, Taoyuan (TW)

(72) Inventors: Mao-Feng Hsu, Taoyuan (TW); Chen-Feng Yen, Taoyuan (TW); Shou-Jui Hsiang, Taoyuan (TW); Yen-Chin Hsiao, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 0 days.

(21) Appl. No.: 15/484,135

(22) Filed: Apr. 11, 2017

(65) Prior Publication Data

US 2017/0362361 A1 Dec. 21, 2017

(30) Foreign Application Priority Data

Jun. 16, 2016 (TW) .............................. 105118917 A

(51) Int. Cl.
| | |
|---|---|
| *C08F 220/32* | (2006.01) |
| *G03F 7/029* | (2006.01) |
| *G03F 7/11* | (2006.01) |
| *H05K 1/03* | (2006.01) |

(Continued)

(52) U.S. Cl.
CPC .............. *C08F 220/32* (2013.01); *C08F 2/48* (2013.01); *G03F 7/027* (2013.01); *G03F 7/029* (2013.01);

(Continued)

(58) Field of Classification Search
CPC ...... C08F 220/32; C08F 2/48; C08F 2222/32; C08F 2222/1086; C08F 2222/1026;

(Continued)

(56) References Cited

U.S. PATENT DOCUMENTS 4,789,620 A * 12/1988 Sasaki ..................... G03F 7/027
430/280.1
2007/0009834 A1 1/2007 Hasegawa et al.

(Continued)

FOREIGN PATENT DOCUMENTS

| CN | 1892427 A | 1/2007 |
|---|---|---|
| CN | 101925840 A | 12/2010 |

(Continued)

*Primary Examiner* — Sanza L. McClendon
(74) *Attorney, Agent, or Firm* — ScienBiziP, P.C.

(57) ABSTRACT

A non-reactive photosensitive resin composition storable at room temperature comprises a carboxylic acid-modified bisphenol epoxy (meth)acrylate, a photosensitive monomer, a photosensitive prepolymer, a photo-initiator, and a coloring agent. Each of the carboxylic acid-modified bisphenol epoxy (meth)acrylate, photosensitive monomer, and photosensitive prepolymer has a plurality of carbon-carbon double bonds, so that the carboxylic acid-modified bisphenol epoxy (meth)acrylate, photosensitive monomer and photosensitive prepolymer may be polymerized to form a dense cross-linking network structure when the photosensitive resin composition is exposed to ultraviolet radiation. A film and a printed circuit board using the photosensitive resin composition are also provided.

17 Claims, 3 Drawing Sheets

(51) Int. Cl.
*H05K 3/46* (2006.01)
*H05K 3/06* (2006.01)
*C08F 2/48* (2006.01)
*G03F 7/027* (2006.01)
*G03F 7/031* (2006.01)
*H05K 3/28* (2006.01)

(52) U.S. Cl.
CPC ............... *G03F 7/031* (2013.01); *G03F 7/11* (2013.01); *H05K 1/0373* (2013.01); *H05K 3/064* (2013.01); *H05K 3/46* (2013.01); *H05K 3/287* (2013.01); *H05K 2201/0104* (2013.01); *H05K 2203/056* (2013.01)

(58) Field of Classification Search
CPC .... C08F 222/1006; G03F 7/027; G03F 7/029; G03F 7/031; G03F 7/11; H05K 1/0373; H05K 3/064; H05K 3/46; H05K 3/287; H05K 2201/0104; H05K 2203/056
See application file for complete search history.

(56) References Cited

U.S. PATENT DOCUMENTS

2011/0033161 A1    2/2011  Ochiai et al.
2018/0203350 A1*   7/2018  Hsu ..................... G03F 7/031

FOREIGN PATENT DOCUMENTS

TW        201219976 A    5/2012
TW        201324036 A    6/2013

* cited by examiner

PHOTOSENSITIVE RESIN COMPOSITION, AND FILM AND PRINTED CIRCUIT BOARD USING SAME

FIELD

The subject matter herein generally relates to a resin composition, and more particularly, to a photosensitive resin composition, a film using the photosensitive resin composition, and a printed circuit board using the photosensitive resin composition.

BACKGROUND

Printed circuit boards (PCBs) usually include solder mask coatings applied to the copper traces for protection against oxidation, and to prevent solder bridges being generated between adjacent solder pads. The solder mask coating is formed by a solder mask ink, which includes a base agent and a hardening agent. The base agent comprises epoxy acrylate. The hardening agent comprises epoxy resin. The epoxy acrylate usually includes carboxyl groups (—COOH) so that the solder mask coating may be etched by an alkali solution during exposure and development. However, the epoxy groups of the epoxy resin may react with the carboxyl groups of the epoxy acrylate under a normal temperature, so that the solder mask ink must be stored at a temperature lower than 5 degrees Celsius, which increases the cost for storage.

BRIEF DESCRIPTION OF THE DRAWINGS

Implementations of the present technology will now be described, by way of example only, with reference to the attached figures.

DETAILED DESCRIPTION

Figure 1:
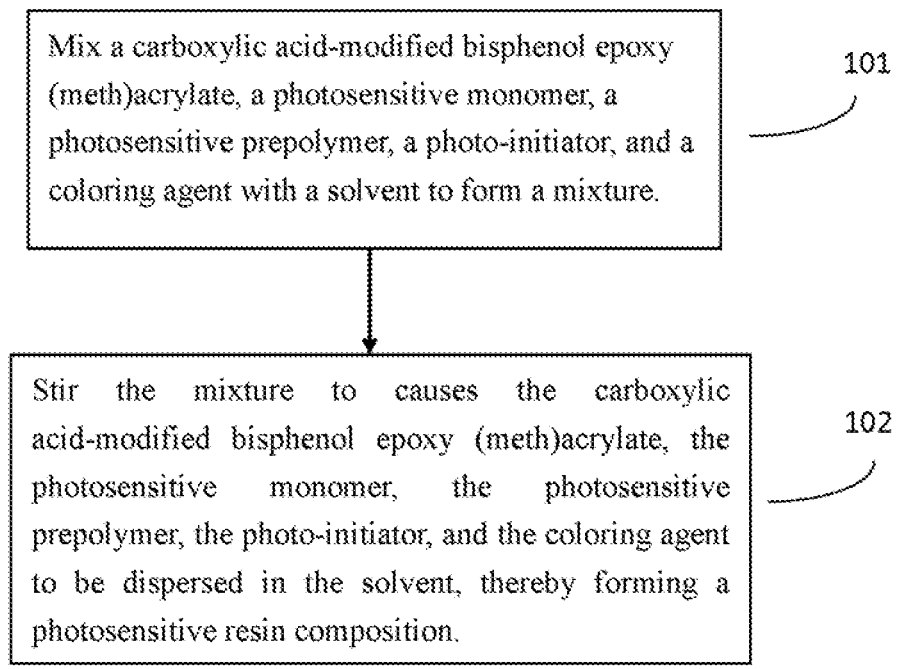
FIG. 1 is a flowchart of an embodiment of a method for making a photosensitive resin composition in accordance with an exemplary embodiment.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to illustrate details and features of the present disclosure better.

Several definitions that apply throughout this disclosure will now be presented.

The term "comprising" when utilized, means "including, but not necessarily limited to"; it specifically indicates open-ended inclusion or membership in the so-described combination, group, series, and the like. The term "about" when utilized, means "not only include the numerical value, but also include number closest to the numerical value".

An exemplary embodiment of a photosensitive resin composition comprises a carboxylic acid-modified bisphenol epoxy (meth)acrylate, a photosensitive monomer, a photosensitive prepolymer, a photo-initiator, and a coloring agent. Each of the carboxylic acid-modified bisphenol epoxy (meth)acrylate, photosensitive monomer and photosensitive prepolymer has a plurality of carbon-carbon double bonds, so that the carboxylic acid-modified bisphenol epoxy (meth)acrylate, photosensitive monomer and photosensitive prepolymer may be polymerized to form a dense cross-linking network structure when the photosensitive resin composition is exposed to ultraviolet radiation.

The ratio of the number of the carbon-carbon double bonds in the carboxylic acid-modified bisphenol epoxy (meth)acrylate and the number of the carbon-carbon double bonds in the photosensitive monomer is about 1:20 to about 1:50.

The carboxylic acid-modified bisphenol epoxy (meth)acrylate is in an amount by weight of about 100 parts in the photosensitive resin composition, the photosensitive monomer is in an amount by weight of about 20 parts to about 80 parts in the photosensitive resin composition, and the photosensitive prepolymer is in an amount by weight of about 10 parts to about 40 parts in the photosensitive resin composition. The photo-initiator is in an amount by weight of about 5 parts to about 15 parts in the photosensitive resin composition, and the coloring agent is in an amount by weight of about 1 parts to about 5 parts in the photosensitive resin composition.

In at least one exemplary embodiment, the photosensitive resin composition has a surface energy of about 30 dyne to about 60 dyne.

In at least one exemplary embodiment, the carboxylic acid-modified bisphenol epoxy (meth)acrylate has a molecular weight of about 15000 g/mol to about 35000 g/mol, ensuring that the surface energy of the photosensitive resin composition is in a range from about 30 dyne to about 60 dyne, and to ensure that there are no breaks when using the photosensitive resin composition to make film. In at least one exemplary embodiment, the carboxylic acid-modified bisphenol epoxy (meth)acrylate has an acid value of about 70 mgKOH/g to about 130 mgKOH/g.

The photosensitive monomer comprises functional groups selected from —C(CH$_3$)$_2$—, —CF$_2$—, —CH$_2$—CH$_2$—CH$_2$—O—,

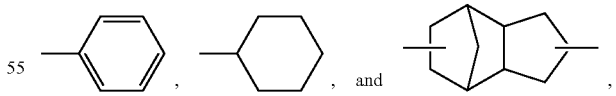

or any combination thereof. These functional groups have a small polarity, ensuring that the surface energy of the photosensitive resin composition is in a range from about 30 dyne to about 60 dyne. The photosensitive monomer may be selected from a group consisting of propoxylated (3) trimethylolpropane triacrylate [TMP(3PO)TA] and dipentaerythritol hexaacrylate (DPHA), or any combination thereof. The photosensitive monomer is configured to increase viscosity and adhesion strength of the photosensitive resin composition.

The photosensitive prepolymer is urethane (meth)acrylate. The urethane (meth)acrylate has a molecular weight of about 3000 g/mol to about 10000 g/mol. The urethane (meth)acrylate has an elongation of about 200% to about 14000%.

The photo-initiator can absorb ultraviolet radiation to generate free radicals or positive ions when the photosensitive resin composition is exposed to ultraviolet radiation. The free radicals or positive ions can cause the carboxylic acid-modified bisphenol epoxy (meth)acrylate, photosensitive monomer, and photosensitive prepolymer to polymerize to form a dense cross-linking network structure. The photo-initiator may be selected from a group consisting of α-hydroxy ketones, acylphosphine oxide, amino ketone compound, and oxime ester compound, or any combination thereof. In at least one exemplary embodiment, the photo-initiator may be selected from a group consisting of 2-hydroxy-2-methyl-1-phenyl-1-acetone, 1-hydroxy cyclohexyl phenyl ketone, Diphenyl(2,4,6-trimethylbenzoyl)phosphine oxide, 2-methyl-4'-(methylthio)-2-morpholinopropiophenone, phenyl bis(2,4,6-trimethylbenzoyl)-phosphine oxide, 2-Benzyl-2-(dimethylamino)-4'-morpholinobutyrophenone, 2,2-dimethoxy-2-phenylacetophenone, benzophenone, isopropyl thioxanthone, and carbazole oxime ester, or any combination thereof.

The coloring agent can allow desired colors for the photosensitive resin composition. The coloring agent may be selected from a group consisting of a pigment, a dye, or any combination thereof. The pigment may be selected from a group consisting of an inorganic pigment, an organic pigment, or any combination thereof. The dye may be selected from a group consisting of a natural organic dye, synthesized organic dye, or any combination thereof.

The photosensitive resin composition may further comprise a solvent. The solvent may be selected from a group consisting of ethanol, ethyl ether, toluene, butanone, or any combination thereof.

The photosensitive resin composition may further comprise a filler. The filler may be selected from a group consisting of an inorganic filler, an organic filler, or any combination thereof. The filler is configured to improve the mechanical properties of the photosensitive resin composition.

The photosensitive resin composition further comprise an additive. The additive may be selected from a group consisting of a thickening agent, a leveling agent, an antifoaming agent, a flame retardant, or any combination thereof.

The photosensitive resin composition does not comprise an epoxy resin, thereby epoxy resin reacting with the carboxyl groups contained in the photosensitive resin composition does not occur. Thereby the photosensitive resin composition may be stored at a normal atmospheric temperature for a long time.

FIG. 1 illustrates a flowchart of a method for making the photosensitive resin composition in accordance with an exemplary embodiment. The exemplary method is provided by way of example, as there are a variety of ways to carry out the method. Each block shown in the figure represents one or more processes, methods or subroutines, carried out in the exemplary method. Furthermore, the illustrated order of blocks is by example only, and the order of the blocks can change. Additional blocks may be added, or fewer blocks may be utilized, without departing from this disclosure. The exemplary method may begin at block 101.

At block 101, a carboxylic acid-modified bisphenol epoxy (meth)acrylate, a photosensitive monomer, a photosensitive prepolymer, a photo-initiator, and a coloring agent are mixed with a solvent to form a mixture. The carboxylic acid-modified bisphenol epoxy (meth)acrylate is in an amount by weight of about 100 parts in the mixture, the photosensitive monomer is in an amount by weight of about 20 parts to about 80 parts in the mixture, the photosensitive prepolymer is in an amount by weight of about 10 parts to about 40 parts in the mixture, the photo-initiator is in an amount by weight of about 5 parts to about 15 parts in the mixture, the coloring agent is in an amount by weight of about 1 parts to about 5 parts in the mixture. The amount of the solvent may be adjusted, ensuring that all the above components may be dissolved in the solvent.

At blocked 102, the mixture is stirred to causes the carboxylic acid-modified bisphenol epoxy (meth)acrylate, the photosensitive monomer, the photosensitive prepolymer, the photo-initiator, and the coloring agent to be dispersed in the solvent, thereby forming the photosensitive resin composition.

Figure 2:
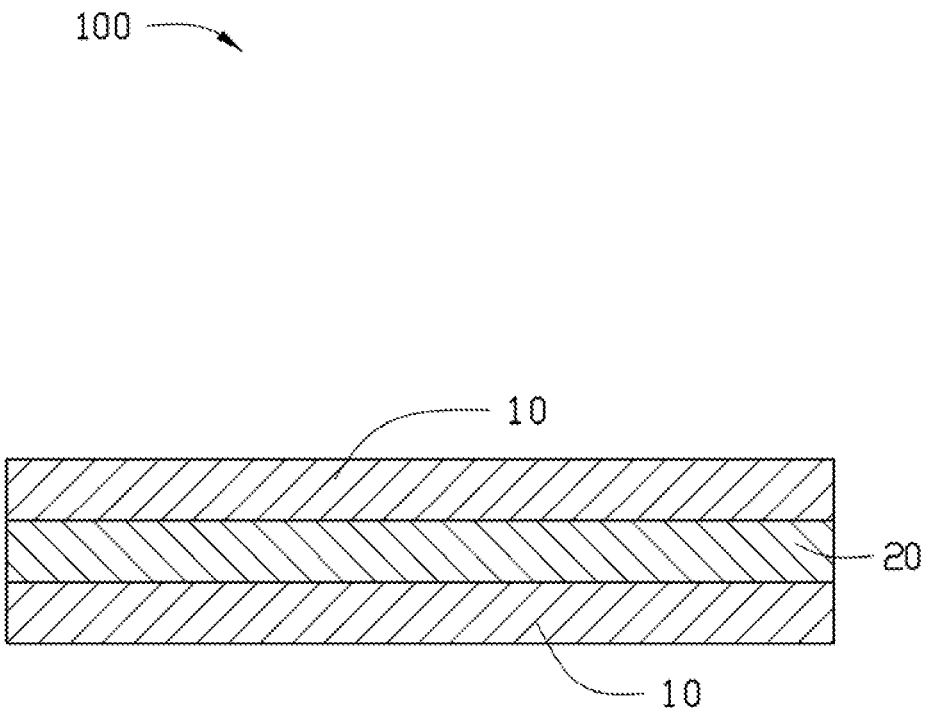
FIG. 2 is a diagrammatic view of an exemplary embodiment showing photosensitive resin composition being coated on a release film.

FIG. 2 illustrates an exemplary embodiment of a film 100 including a resin layer 20, and a release film 10 attached to at least one surface of the resin layer 20. The resin layer 20 is formed by coating the photosensitive resin composition on a surface of the release film 10 and then drying the photosensitive resin composition.

Figure 3:
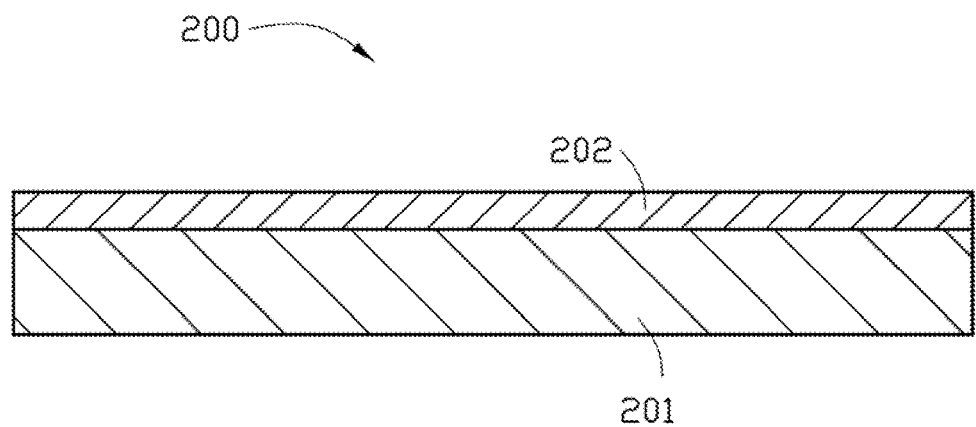
FIG. 3 is a diagrammatic view of a printed circuit board according to an exemplary embodiment of the present application.

FIG. 3 illustrates an exemplary embodiment of a printed circuit board 200 including a circuit substrate 201, and an insulating layer 202 attached to at least one surface of the circuit substrate 201. The insulating layer 202 is made by sticking the resin layer 20 to the surface of the circuit substrate 201 and exposing the resin layer 20 to ultraviolet radiation.

An exemplary embodiment of a method for making the printed circuit board 200 may include the following steps: (1) sticking the resin layer 20 of the film 100 to a surface of the circuit substrate 201; (2) removing the release film 10 of the film 100; (3) emitting ultraviolet light towards the resin layer 20, to cause the carboxylic acid-modified bisphenol epoxy (meth)acrylate, photosensitive monomer and photosensitive prepolymer in the resin layer 20 to polymerize. That is, the epoxy acrylate, the acrylate monomers, and the acrylate oligomers undergo an ultraviolet solidifying reaction. The ultraviolet light has a power that no less than 300 mj/cm$^2$.

The ultraviolet solidifying reaction can form a cross-linking network structure which can improve a cross-linking density of the photosensitive resin composition, so that the insulating layer 202 can have an improved alkalis resistance and solder heat resistance, and the printed circuit board 200 can have an improved thermal resistance.

Example 1

Carboxylic acid-modified bisphenol epoxy (meth)acrylate, propoxylated (3) trimethylolpropane triacrylate, dipentaerythritol hexaacrylate, urethane (meth)acrylate, 2-methyl-4'-(methylthio)-2-morpholinopropiophenone, isopropyl thioxanthone, coloring agent, and butanone were added into a container of 500 mL to form a mixture, the mixture were stirred to form the photosensitive resin composition.

The mass of the carboxylic acid-modified bisphenol epoxy (meth)acrylate was 100 g, the mass of the propoxylated (3) trimethylolpropane triacrylate was 30 g, the mass of the dipentaerythritol hexaacrylate was 10 g, the mass of the urethane (meth)acrylate was 20 g, the mass of the 2-methyl-4'-(methylthio)-2-morpholinopropiophenone was 7 g, the mass of the isopropyl thioxanthone was 3 g, the mass of the coloring agent was 2 g, and the mass of the butanone was 40 g.

Comparative Example 1

Carboxylic acid-modified bisphenol epoxy (meth)acrylate, propoxylated (3) trimethylolpropane triacrylate, dipentaerythritol hexaacrylate, urethane (meth)acrylate, 2-methyl-4'-(methylthio)-2-morpholinopropiophenone, isopropyl thioxanthone, coloring agent, and butanone were added into a container of 500 mL to form a mixture, the mixture were stirred to form a resin composition.

The mass of the carboxylic acid-modified bisphenol epoxy (meth)acrylate was 100 g, the mass of the propoxylated (3) trimethylolpropane triacrylate was 12 g, the mass of the dipentaerythritol hexaacrylate was 4 g, the mass of the urethane (meth)acrylate was 20 g, the mass of the 2-methyl-4'-(methylthio)-2-morpholinopropiophenone was 7 g, the mass of the isopropyl thioxanthone was 3 g, the mass of the coloring agent was 2 g, and the mass of the butanone was 40 g.

Comparative Example 2

Carboxylic acid-modified bisphenol epoxy (meth)acrylate, ethoxylated trimethylolpropane triacrylate, dipentaerythritol hexaacrylate, urethane (meth)acrylate, 2-methyl-4'-(methylthio)-2-morpholinopropiophenone, isopropyl thioxanthone, coloring agent, and butanone were added into a container of 500 mL to form a mixture, the mixture were stirred to form a resin composition.

The mass of the carboxylic acid-modified bisphenol epoxy (meth)acrylate was 100 g, the mass of the ethoxylated trimethylolpropane triacrylate was 30 g, the mass of the dipentaerythritol hexaacrylate was 10 g, the mass of the urethane (meth)acrylate was 20 g, the mass of the 2-methyl-4'-(methylthio)-2-morpholinopropiophenone was 7 g, the mass of the isopropyl thioxanthone was 3 g, the mass of the coloring agent was 2 g, and the mass of the butanone was 40 g.

Comparative Example 3

Carboxylic acid-modified bisphenol epoxy (meth)acrylate, propoxylated (3) trimethylolpropane triacrylate, dipentaerythritol hexaacrylate, 2-methyl-4'-(methylthio)-2-morpholinopropiophenone, isopropyl thioxanthone, coloring agent, and butanone were added into a container of 500 mL to form a mixture, the mixture was stirred to form a resin composition.

The mass of the carboxylic acid-modified bisphenol epoxy (meth)acrylate was 100 g, the mass of the propoxylated (3) trimethylolpropane triacrylate was 30 g, the mass of the dipentaerythritol hexaacrylate was 10 g, the mass of the 2-methyl-4'-(methylthio)-2-morpholinopropiophenone was 7 g, the mass of the isopropyl thioxanthone was 3 g, the mass of the coloring agent was 2 g, and the mass of the butanone was 40 g.

Comparative Example 4

Carboxylic acid-modified bisphenol epoxy (meth)acrylate, propoxylated (3) trimethylolpropane triacrylate, dipentaerythritol hexaacrylate, bisphenol A diglycidyl ether epoxy, melamine, 2-methyl-4'-(methylthio)-2-morpholinopropiophenone, isopropyl thioxanthone, coloring agent, and butanone were added into a container of 500 mL to form a mixture, the mixture were stirred to form a resin composition.

The mass of the carboxylic acid-modified bisphenol epoxy (meth)acrylate was 100 g, the mass of the propoxylated (3) trimethylolpropane triacrylate was 30 g, the mass of the dipentaerythritol hexaacrylate was 10 g, the mass of the bisphenol A diglycidyl ether epoxy was 18.5 g, the mass of the melamine was 0.55 g, the mass of the 2-methyl-4'-(methylthio)-2-morpholinopropiophenone was 7 g, the mass of the isopropyl thioxanthone was 3 g, the mass of the coloring agent was 2 g, and the mass of the butanone was 40 g.

Printed circuit boards were formed by the photosensitive resin compositions of the above example 1 and the resin compositions of the above comparative examples 1-4. The printed circuit boards were performed by an adhesion strength test under ASTM standard, an alkalis resistance test, a thermal resistance test, a flexibility test, a dyne test, and a storage stability test under the normal temperature. The test results are shown in table 1. The alkalis resistant test was carried out by immersing the printed circuit boards into a sodium hydroxide solution having a mass concentration of about 10% and observing whether the photosensitive solder masks were peeled off. The flexibility test was carried out by bending the printed circuit boards through 180 degrees Celsius and calculating the number of times that the printed circuit board remained non-fractured after being bent. The thermal resistance test was carried out by exposing the printed circuit board to a temperature equal to or greater than 260 degrees Celsius for 10 seconds and observing whether the photosensitive solder masks were peeled off or dropped out from the printed circuit boards. The storage stability test under the normal temperature was carried out by making the printed circuit boards by the photosensitive resin compositions and the resin compositions which were stored under the normal temperature for one month, repeating the adhesion strength test, the alkalis resistance test, the thermal resistance test, and determining whether the test results were deteriorated. If so, the properties of the photosensitive resin compositions or the resin compositions remained unchanged during the storage; otherwise, the properties were changed during the storage.

TABLE 1

| | product | | | | |
|---|---|---|---|---|---|
| property | example 1 | comparative example 1 | comparative example 2 | comparative example 3 | comparative example 4 |
| adhesion strength | 5 B | 3 B | 2 B | 4 B | 5 B |
| alkalis resistance | not peeled off after 30 min | generate minor holes after 30 min | peeled off after 30 min | peeled off after 30 min | not peeled off after 30 min |

TABLE 1-continued

| property | example 1 | comparative example 1 | comparative example 2 | comparative example 3 | comparative example 4 |
|---|---|---|---|---|---|
| thermal resistance | 288 degrees Celsius for 10 seconds not peeled off | 260 degrees Celsius for 10 seconds not peeled off | 260 degrees Celsius for 10 seconds not peeled off | 260 degrees Celsius for 10 seconds not peeled off | 288 degrees Celsius for 10 seconds not peeled off |
| flexibility | 13 times | 1 time | 0 time | 1 time | 1 time |
| surface energy | 56 dyne | 66 dyne | greater than 70 dyne | — | — |
| storage stability | unchanged | unchanged | unchanged | unchanged | changed |

Table 1 illustrates that the printed circuit board formed by the photosensitive resin composition of the above example 1 and the resin composition of the above comparative example 4 have improved adhesion strength and thermal resistance, comparing to the printed circuit boards formed by the resin composition of the above comparative examples 1-3. The printed circuit board formed by the photosensitive resin composition of the above example 1 has improved flexibility, comparing to the printed circuit boards formed by the resin compositions of the above comparative examples 1-4. The photosensitive resin composition of the above example 1 has lower surface energy, comparing to the resin compositions of the above comparative examples 1-2, and the surface energy of the resin compositions of the above comparative examples 3-4 cannot be tested. The photosensitive resin composition of the above example 1 and the resin compositions of the above comparative examples 1-3 have improved storage stability, comparing to the resin composition of the above comparative example 4.

The embodiments shown and described above are only examples. Even though numerous characteristics and advantages of the present technology have been set forth in the foregoing description, together with details of the structures and function of the present disclosure, the disclosure is illustrative only, and changes can be made in the detail, including in matters of shape, size, and arrangement of the parts within the principles of the present disclosure, up to and including, the full extent established by the broad general meaning of the terms used in the claims.

What is claimed is:

1. A photosensitive resin composition comprising:
   a carboxylic acid-modified bisphenol epoxy (meth)acrylate;
   a photosensitive monomer;
   a photosensitive prepolymer;
   a photo-initiator; and
   a coloring agent;
   wherein each of the carboxylic acid-modified bisphenol epoxy (meth)acrylate, photosensitive monomer and photosensitive prepolymer has carbon-carbon double bonds, a ratio of the number of the carbon-carbon double bonds in the carboxylic acid-modified bisphenol epoxy (meth)acrylate and the number of the carbon-carbon double bonds in the photosensitive monomer is substantially between 1:20 and 1:50, the carboxylic acid-modified bisphenol epoxy (meth)acrylate has a molar mass of about 15000 g/mol to about 35000 g/mol, the carboxylic acid-modified bisphenol epoxy (meth)acrylate has an acid value of about 70 mgKOH/g to about 130 mgKOH/g; and
   wherein the carboxylic acid-modified bisphenol epoxy (meth)acrylate, photosensitive monomer and photosensitive prepolymer polymerize to form a dense cross-linking network structure when the photosensitive resin composition is exposed to ultraviolet radiation.

2. The photosensitive resin composition of claim 1, wherein the photosensitive resin composition has a surface energy of about 30 dyne to about 60 dyne.

3. The photosensitive resin composition of claim 1, wherein the carboxylic acid-modified bisphenol epoxy (meth)acrylate is in an amount by weight of about 100 parts in the photosensitive resin composition, the photosensitive monomer is in an amount by weight of about 20 parts to about 80 parts in the photosensitive resin composition, the photosensitive prepolymer is in an amount by weight of about 10 parts to about 40 parts in the photosensitive resin composition, the photo-initiator is in an amount by weight of about 5 parts to about 15 parts in the photosensitive resin composition, the coloring agent is in an amount by weight of about 1 parts to about 5 parts in the photosensitive resin composition.

4. The photosensitive resin composition of claim 1, wherein the photosensitive monomer is selected from a group consisting of propoxylated (3) trimethylolpropane triacrylate and dipentaerythritol hexaacrylate, or any combination thereof.

5. The photosensitive resin composition of claim 1, wherein the photosensitive prepolymer is urethane (meth)acrylate.

6. The photosensitive resin composition of claim 1, wherein the photo-initiator is selected from a group consisting of 2-hydroxy-2-methyl-1-phenyl-1-acetone, 1-hydroxy cyclohexyl phenyl ketone, Diphenyl(2,4,6-trimethylbenzoyl)phosphine oxide, 2-methyl-4'-(methylthio)-2-morpholinopropiophenone, phenyl bis(2,4,6-trimethylbenzoyl)-phosphine oxide, 2-Benzyl-2-(dimethylamino)-4'-morpholinobutyrophenone, 2,2-dimethoxy-2-phenylacetophenone, benzophenone, isopropyl thioxanthone, and carbazole oxime ester, or any combination thereof.

7. A film comprising:
   at least one release film; and
   a resin layer, at least one surface of the resin layer is attached to one surface of the at least one release film, the resin layer is made by a photosensitive resin composition, the photosensitive resin composition comprising:
   a carboxylic acid-modified bisphenol epoxy (meth)acrylate;
   a photosensitive monomer;
   a photosensitive prepolymer;

a photo-initiator; and
a coloring agent;
wherein each of the carboxylic acid-modified bisphenol epoxy (meth)acrylate, photosensitive monomer and photosensitive prepolymer has carbon-carbon double bonds, a ratio of the number of the carbon-carbon double bonds in the carboxylic acid-modified bisphenol epoxy (meth)acrylate and the number of the carbon-carbon double bonds in the photosensitive monomer is substantially between 1:20 and 1:50, the carboxylic acid-modified bisphenol epoxy (meth)acrylate has a molar mass of about 15000 g/mol to about 35000 g/mol, the carboxylic acid-modified bisphenol epoxy (meth)acrylate has an acid value of about 70 mgKOH/g to about 130 mgKOH/g; and
wherein the carboxylic acid-modified bisphenol epoxy (meth)acrylate, photosensitive monomer and photosensitive prepolymer polymerize to form a dense cross-linking network structure when the photosensitive resin composition is exposed to ultraviolet radiation.

8. The film of claim 7, wherein the photosensitive resin composition has a surface energy of about 30 dyne to about 60 dyne.

9. The film of claim 7, wherein the carboxylic acid-modified bisphenol epoxy (meth)acrylate is in an amount by weight of about 100 parts in the photosensitive resin composition, the photosensitive monomer is in an amount by weight of about 20 parts to about 80 parts in the photosensitive resin composition, the photosensitive prepolymer is in an amount by weight of about 10 parts to about 40 parts in the photosensitive resin composition, the photo-initiator is in an amount by weight of about 5 parts to about 15 parts in the photosensitive resin composition, the coloring agent is in an amount by weight of about 1 parts to about 5 parts in the photosensitive resin composition.

10. The film of claim 7, wherein the photosensitive monomer is selected from a group consisting of propoxylated (3) trimethylolpropane triacrylate and dipentaerythritol hexaacrylate, or any combination thereof.

11. The film of claim 7, wherein the photosensitive prepolymer is urethane (meth)acrylate.

12. The film of claim 7, wherein the photo-initiator is selected from a group consisting of 2-hydroxy-2-methyl-1-phenyl-1-acetone, 1-hydroxy cyclohexyl phenyl ketone, Diphenyl(2,4,6-trimethylbenzoyl)phosphine oxide, 2-methyl-4'-(methylthio)-2-morpholinopropiophenone, phenyl bis(2,4,6-trimethylbenzoyl)-phosphine oxide, 2-Benzyl-2-(dimethylamino)-4'-morpholinobutyrophenone, 2,2-dimethoxy-2-phenylacetophenone, benzophenone, isopropyl thioxanthone, and carbazole oxime ester, or any combination thereof.

13. A printed circuit board comprising:
a circuit substrate; and
an insulating layer attached to at least one surface of the circuit substrate, the insulating layer is made by sticking a resin layer to at least one surface of the circuit substrate, and exposing the resin layer to ultraviolet radiation, the resin layer is made by a photosensitive resin composition, the photosensitive resin composition comprising:
a carboxylic acid-modified bisphenol epoxy (meth) acrylate;
a photosensitive monomer;
a photosensitive prepolymer;
a photo-initiator; and
a coloring agent;
wherein each of the carboxylic acid-modified bisphenol epoxy (meth)acrylate, photosensitive monomer and photosensitive prepolymer has carbon-carbon double bonds, a ratio of the number of the carbon-carbon double bonds in the carboxylic acid-modified bisphenol epoxy (meth)acrylate and the number of the carbon-carbon double bonds in the photosensitive monomer is substantially between 1:20 and 1:50, the carboxylic acid-modified bisphenol epoxy (meth)acrylate has a molar mass of about 15000 g/mol to about 35000 g/mol, the carboxylic acid-modified bisphenol epoxy (meth)acrylate has an acid value of about 70 mgKOH/g to about 130 mgKOH/g; and
wherein the carboxylic acid-modified bisphenol epoxy (meth)acrylate, photosensitive monomer and photosensitive prepolymer polymerize to form a dense cross-linking network structure when the photosensitive resin composition is exposed to ultraviolet radiation.

14. The printed circuit board of claim 13, wherein the photosensitive resin composition has a surface energy of about 30 dyne to about 60 dyne.

15. The printed circuit board of claim 13, wherein the carboxylic acid-modified bisphenol epoxy (meth)acrylate is in an amount by weight of about 100 parts in the photosensitive resin composition, the photosensitive monomer is in an amount by weight of about 20 parts to about 80 parts in the photosensitive resin composition, the photosensitive prepolymer is in an amount by weight of about 10 parts to about 40 parts in the photosensitive resin composition, the photo-initiator is in an amount by weight of about 5 parts to about 15 parts in the photosensitive resin composition, the coloring agent is in an amount by weight of about 1 parts to about 5 parts in the photosensitive resin composition.

16. The printed circuit board of claim 13, wherein the photosensitive monomer is selected from a group consisting of propoxylated (3) trimethylolpropane triacrylate and dipentaerythritol hexaacrylate, or any combination thereof, the photosensitive prepolymer is urethane (meth)acrylate.

17. The printed circuit board of claim 13, the photo-initiator is selected from a group consisting of 2-hydroxy-2-methyl-1-phenyl-1-acetone, 1-hydroxy cyclohexyl phenyl ketone, Diphenyl(2,4,6-trimethylbenzoyl)phosphine oxide, 2-methyl-4'-(methylthio)-2-morpholinopropiophenone, phenyl bis(2,4,6-trimethylbenzoyl)-phosphine oxide, 2-Benzyl-2-(dimethylamino)-4'-morpholinobutyrophenone, 2,2-dimethoxy-2-phenylacetophenone, benzophenone, isopropyl thioxanthone, and carbazole oxime ester, or any combination thereof.

* * * * *